(12) United States Patent
You et al.

(10) Patent No.: US 10,332,804 B2
(45) Date of Patent: Jun. 25, 2019

(54) METHOD FOR MANUFACTURING CMOS STRUCTURE

(71) Applicant: Silergy Semiconductor Technology (Hangzhou) Ltd., Hangzhou (CN)

(72) Inventors: Budong You, Hangzhou (CN); Zheng Lyu, Hangzhou (CN); Xianguo Huang, Hangzhou (CN); Chuan Peng, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 14/823,224

(22) Filed: Aug. 11, 2015

(65) Prior Publication Data
US 2016/0043005 A1   Feb. 11, 2016

(30) Foreign Application Priority Data

Aug. 11, 2014 (CN) .......................... 2014 1 0393085
Oct. 29, 2014 (CN) .......................... 2014 1 0594322

(51) Int. Cl.
*H01L 21/82* (2006.01)
*H01L 29/417* (2006.01)
(Continued)

(52) U.S. Cl.
CPC .......... *H01L 21/823814* (2013.01); *H01L 21/823857* (2013.01); *H01L 29/0653* (2013.01);
(Continued)

(58) Field of Classification Search
CPC ..... H01L 21/823425; H01L 21/823418; H01L 21/823814; H01L 21/823842;
(Continued)

(56) References Cited

U.S. PATENT DOCUMENTS 6,267,479 B1 * 7/2001 Yamada .......... H01L 21/823807
257/392
6,879,007 B2   4/2005 Takamura
(Continued)

FOREIGN PATENT DOCUMENTS

CN   1359156 A   7/2002
TW   I232546 B   5/2005

OTHER PUBLICATIONS

First Office Action, including Search Report, for Chinese Patent Application No. 201410594322.3, dated Aug. 8, 2016, 13 pages.
(Continued)

*Primary Examiner* — Thanhha S Pham
(74) *Attorney, Agent, or Firm* — Westman, Champlin & Koehler, P.A.

(57) ABSTRACT

The present disclosure relates to a method for manufacturing a CMOS structure. Shallow trench isolation is formed in a semiconductor substrate. A first region is defined for a first MOSFET and a second MOSFET of a first type and a second region is defined for a third MOSFET and a fourth MOSFET of a second type, by shallow trench isolation. First to fourth Gates sacks are formed on the semiconductor substrate, each of which includes a gate conductor and a gate dielectric and the gate dielectric is disposed between the gate conductor and the semiconductor substrate. The first and second gate stacks are formed in the first region, and the third and fourth gate stacks are formed in the second region. The gate dielectrics of the first and third gate stacks have a first thickness, and the gate dielectrics of the second and fourth gate stacks have a second thickness larger than the first thickness. Some masks are commonly used in various steps in this process so that the number of the masks is reduced.

10 Claims, 9 Drawing Sheets

(51) Int. Cl.
*H01L 21/8238* (2006.01)
*H01L 29/06* (2006.01)
*H01L 29/66* (2006.01)
*H01L 21/8234* (2006.01)

(52) U.S. Cl.
CPC .... *H01L 29/41725* (2013.01); *H01L 29/6656* (2013.01); *H01L 29/66492* (2013.01); *H01L 21/823462* (2013.01); *H01L 21/823842* (2013.01)

(58) Field of Classification Search
CPC ..... H01L 21/823878; H01L 21/823857; H01L 29/41725
See application file for complete search history.

(56) References Cited

U.S. PATENT DOCUMENTS

| | | | |
|---|---|---|---|
| 2004/0026750 A1* | 2/2004 | Takamura | H01L 21/823462 257/391 |
| 2005/0164439 A1 | 7/2005 | Takamura | |
| 2008/0020523 A1* | 1/2008 | Lee | H01L 21/823418 438/197 |
| 2012/0045875 A1* | 2/2012 | Ariyoshi | H01L 21/823807 438/217 |

OTHER PUBLICATIONS

Second Office Action, including Search Report, for Chinese Patent Application No. 201410594322.3, dated Apr. 10, 2017, 15 pages.
Third Office Action for Chinese Patent Application No. 201410594322.3, dated Jul. 28, 2017, 7 pages.

* cited by examiner

METHOD FOR MANUFACTURING CMOS STRUCTURE

CLAIM OF PRIORITY

This application claims priority to Chinese Application No. 201410393085.4, filed Aug. 11, 2014 (published as CN 104143535 A), and claims priority to Chinese Application No. 201410594322.3, filed Oct. 29, 2014 (published as CN 104282629 A), both of which are hereby incorporated by reference.

BACKGROUND OF THE DISCLOSURE

Field of the Disclosure

The present disclosure relates to semiconductor technology, and more particularly, to a method for manufacturing a complementary metal oxide semiconductor (CMOS) structure.

Description of the Related Art

A CMOS structure includes metal-oxide-semiconductor field-effect transistors (MOSFETs) of two opposite types (i.e. N-type and P-type) on one semiconductor substrate. The CMOS structure is widely used in various logical circuits which operates at low power consumption. A control chip of a power converter has advantages of low power consumption, high integration level, and high speed, if being on the basis of a CMOS structure.

To complete a CMOS structure, a well region is typically formed in a semiconductor substrate for at least one type of MOSFET. Source/drain regions of the at least one type of MOSFET are then formed in the well region by ion implantation. The well region has a doping type opposite to that of the MOSFET to be formed therein, and functions as an actual semiconductor substrate of such a MOSFET. Lightly-doped drain (LDD region) regions may also be formed between the source/drain regions and a channel region for improving electric field distribution in the channel region and suppressing a short-channel effect.

In a conventional CMOS process, doping processes are usually independent of each other for different types of MOSFETs. When doped regions of one type of MOSFETs are formed, active regions of the other type of MOSFETs are blocked, or vice versa. A control chip of a power converter typically includes low-voltage MOSFETs and high-voltage MOSFETs having gate dielectrics with different thicknesses if being a CMOS structure. Well regions of the high-voltage MOSFETs are blocked when the low-voltage MOSFETs are formed, or vice versa. Consequently, a large number of masks must be used in various doping steps in the conventional CMOS process, which increases manufacturing cost, and may cause low yield and poor reliability of the product due to possible mismatching of different masks.

Thus, it is desirable to further reduce manufacturing cost of a CMOS process and reduce reliability problem due to the process complexity.

BRIEF DESCRIPTION OF THE DISCLOSURE

In view of this, the present disclosure provides a method for manufacturing a CMOS structure in which less masks are used.

In an embodiment, there is provided a method for manufacturing a CMOS structure, comprising: forming shallow trench isolation in a semiconductor substrate, for defining a first region for a first MOSFET and a second MOSFET of a first type and for defining a second region for a third MOSFET and a fourth MOSFET of a second type; and forming a first to a fourth gate stacks on the semiconductor substrate, wherein the first gate stack and the second gate stack are disposed in the first region, and the third gate stack and the fourth gate stacks are disposed in the second region, each of the first to the fourth gate stacks comprises a gate conductor and a gate dielectric, and the gate dielectric is disposed between the gate conductor and the semiconductor substrate, the gate dielectrics of the first and third gate stacks have a first thickness, and the gate dielectrics of the second and fourth gate stacks have a second thickness larger than the first thickness.

Preferably, after the steps of forming the first to the fourth gate stacks, the method further comprises doping the gate conductors of the third and the fourth gate stacks for adjusting work function.

Preferably, the gate dielectrics of the first and the third gate stacks are formed by using a common mask, and/or the gate dielectrics of the second and the fourth gate stacks are formed by using a common mask.

Preferably, after the steps of forming the first to the fourth gate stacks, the method further comprises forming lightly-doped drain regions and source/drain regions of the first to the fourth MOSFETs.

Preferably, the source/drain regions of the first and the second MOSFETs are formed by using a common mask; and/or the source/drain regions of the third and the fourth MOSFETs are formed by using a common mask.

Preferably, the lightly-doped drain regions of the first and the second MOSFETs are formed by using a common mask; and/or the lightly-doped drain regions of the third and the fourth MOSFETs are formed by using a common mask.

Preferably, the lightly-doped drain regions and the source/drain regions of at least one of the first to the fourth MOSFETs are formed by using a common mask.

Preferably, the step of forming the lightly-doped drain regions and the source/drain regions of the first to the fourth MOSFETs comprises: implanting a dopant of the first type by using a first mask and with the first gate stack as a hard mask, to form first lightly-doped drain regions of the first type; implanting a dopant of the second type by using a second mask and with the third gate stack as a hard mask, to form third lightly-doped drain regions of the second type; implanting a dopant of the second type by using a third mask and with the fourth gate stack as a hard mask, to form fourth lightly-doped drain regions of the second type; forming gate spacers at side walls of the first to the fourth gate stacks; implanting a dopant of the first type by using a fourth mask and with the second gate stack and the gate spacers together as a hard mask, to form second lightly-doped drain regions of the first type and the source/drain regions of the first type; and implanting a dopant of the first type by using a fifth mask and with the first gate stack as a hard mask, to form the source/drain regions of the first type; and implanting a dopant of the second type by using a sixth mask and with the third gate stack, the fourth gate stack and the gate spacers together as a hard mask, to form the source/drain regions of the second type, wherein each of the first to the fourth masks exposes respective one of active regions of the first, the third, the fourth and the second MOSFETs, and blocks other regions of the semiconductor substrate, the fifth mask exposes an active region of the first MOSFET and blocks other regions of the semiconductor substrate, and the sixth mask exposes the second region, and blocks other regions of the semiconductor substrate.

Preferably, the step of forming the lightly-doped drain regions and the source/drain regions of the first to the fourth MOSFETs comprises: implanting a dopant of the first type by using a first mask and with the first gate stack as a hard mask, to form first lightly-doped drain regions of the first type; implanting a dopant of the first type by using a second mask and with the second gate stack as a hard mask, to form second lightly-doped drain regions of the first type; forming gate spacers at side walls of the first to the fourth gate stacks; implanting a dopant of the second type by using a third mask and with the third gate stack and the gate spacers together as a hard mask, to form third lightly-doped drain regions of the second type and the source/drain regions of the second type; and implanting a dopant of the second type by using a fourth mask and with the fourth gate stack and the gate spacers together as a hard mask, to form fourth lightly-doped drain regions of the second type and the source/drain regions of the second type; and implanting a dopant of the first type by using a fifth mask and with the first gate stack and the second gate stack together as a hard mask, to form the source/drain regions of the first type, wherein each of the first to the fourth masks exposes respective one of active regions of the first to the fourth MOSFETs, and blocks other regions of the semiconductor substrate, the fifth mask exposes the first region and blocks other regions of the semiconductor substrate.

Preferably, the step of forming the lightly-doped drain regions and the source/drain regions of the first to the fourth MOSFETs comprises: implanting a dopant of the first type by using a first mask and with the first gate stack as a hard mask, to form first lightly-doped drain regions of the first type; implanting a dopant of the second type by using a second mask and with the third gate stack as a hard mask, to form third lightly-doped drain regions of the second type; forming gate spacers at side walls of the first to the fourth gate stacks; implanting a dopant of the first type by using a third mask and with the second gate stack and the gate spacers together as a hard mask, to form second lightly-doped drain regions of the first type and the source/drain regions of the first type; implanting a dopant of the second type by using a fourth mask and with the fourth gate stack and the gate spacers together as a hard mask, to form fourth lightly-doped drain regions of the second type and the source/drain regions of the second type; and implanting a dopant of the first type by using a fifth mask and with the first gate stack as a hard mask, to form the source/drain regions of the first type; and implanting a dopant of the second type by using a sixth mask and with the third gate stack as a hard mask, to form the source/drain regions of the second type, wherein each of the first to the fourth masks exposes respective one of active regions of the first, the third, the second and the fourth MOSFETs, and blocks other regions of the semiconductor substrate, the fifth mask exposes the first region and blocks other regions of the semiconductor substrate, the sixth mask exposes the second region, and blocks other regions of the semiconductor substrate.

Preferably, the step of forming the lightly-doped drain regions and the source/drain regions of the first to the fourth MOSFETs comprises: implanting a dopant of the first type by using a first mask and with the first gate stack as a hard mask, to form first lightly-doped drain regions of the first type; forming gate spacers at side walls of the first to the fourth gate stacks; implanting a dopant of the first type by using a second mask and with the second gate stack and the gate spacers together as a hard mask, to form second lightly-doped drain regions of the first type and the source/drain regions of the first type; implanting a dopant of the second type by using a third mask and with the third gate stack and the gate spacers together as a hard mask, to form third lightly-doped drain regions of the second type and the source/drain regions of the second type; and implanting a dopant of the second type by using a fourth mask and with the fourth gate stack and the gate spacers together as a hard mask, to form fourth lightly-doped drain regions of the second type and the source/drain regions of the second type; implanting a dopant of the first type by using a fifth mask and with the first gate stack as a hard mask, to form the source/drain regions of the first type; implanting a dopant of the second type by using a sixth mask and with the third gate stack as a hard mask, to form the source/drain regions of the second type, wherein each of the first to the fourth masks exposes respective one of active regions of the first to the fourth MOSFETs, and blocks other regions of the semiconductor substrate, the fifth mask exposes the first region and blocks other regions of the semiconductor substrate, the sixth mask exposes the second region, and blocks other regions of the semiconductor substrate.

Preferably, the step of forming the lightly-doped drain regions and the source/drain regions of the first to the fourth MOSFETs comprises: implanting a dopant of the first type by using a first mask and with the first gate stack as a hard mask, to form first lightly-doped drain regions of the first type; implanting a dopant of the first type by using a second mask and with the second gate stack as a hard mask, to form second lightly-doped drain regions of the first type; implanting a dopant of the second type by using a third mask and with the third gate stack as a hard mask, to form third lightly-doped drain regions of the second type; implanting a dopant of the second type by using a fourth mask and with the fourth gate stack as a hard mask, to form fourth lightly-doped drain regions of the second type; forming gate spacers at side walls of the first to the fourth gate stacks; implanting a dopant of the first type by using a fifth mask and with the first gate stack, the second gate stack, the gate spacers and the shallow trench isolation together as a hard mask, to form the source/drain regions of the first type; and implanting a dopant of the second type by using a sixth mask and with the third gate stack, the fourth gate stack, the gate spacers, and the shallow trench isolation together as a hard mask, to form the source/drain regions of the second type, wherein each of the first to the fourth masks exposes respective one of active regions of the first to the fourth MOSFETs, and blocks other regions of the semiconductor substrate, and the fifth mask and the sixth mask expose the first region and the second region respectively, and block other regions of the semiconductor substrate.

Preferably, the step of forming the lightly-doped drain regions and the source/drain regions of the first to the fourth MOSFETs comprises: implanting a dopant of the first type by using a first mask and with the first gate stack and the second gate stack together as a hard mask, to form first lightly-doped drain regions of the first type and second lightly-doped drain regions of the first type; implanting a dopant of the second type by using a second mask and with the third gate stack and the fourth gate stack together as a hard mask, to form third lightly-doped drain regions of the second type and fourth lightly-doped drain regions of the second type; forming gate spacers at side walls of the first to the fourth gate stacks; implanting a dopant of the first type by using a third mask and with the first gate stack, the second gate stack, the gate spacers and the shallow trench isolation together as a hard mask, to form the source/drain regions of the first type; and implanting a dopant of the second type by using a fourth mask and with the third gate stack, the fourth gate stack, the gate spacers, and the shallow trench isolation together as a hard mask, to form the source/drain regions of the second type, wherein the first mask and the second mask expose the first region and the second region respectively, and blocks other regions of the semiconductor substrate, and the third mask and the fourth mask expose the first region and the second region respectively, and block other regions of the semiconductor substrate.

Preferably, after the steps of forming the first to the fourth gate stacks, the method further comprises doping the gate conductors of the third and the fourth gate stacks for adjusting work function.

Preferably, the gate conductor is made of polysilicon.

Preferably, between the step of forming the shallow trench isolation and the step of forming the first gate stack and the second get stack, the method further comprises at least one of: forming a first well region of the second type by implanting a dopant of the second type in the first region of the semiconductor substrate; and forming a second well region of the first type by implanting the dopant of the first type in the second region of the semiconductor substrate.

Preferably, after the steps of forming the first lightly-doped drain region and forming the second lightly-doped drain region, the method further comprises: performing silicidation to form a metal silicide layer on the source/drain regions of the first type, on the source/drain regions of the second type, and on the gate stack.

Preferably, the first type is one of an N type and a P type, and the second type is the other of the N type and the P type.

In the present method, the source/drain regions of the first and the second MOSFETs are formed by using a common mask and in some common steps; and the source/drain regions of the third and the fourth MOSFETs are formed by using a common mask and in some common steps. Moreover, the first and the second MOSFETs having gate dielectrics with different thicknesses are formed in a common first region of the semiconductor substrate, and the third and the fourth MOSFETs having gate dielectrics with different thicknesses are formed in a common second region of the semiconductor substrate. There is no need for providing various regions with different doping concentrations of the semiconductor substrate, or for forming source/drain regions independently. Thus, the number of the masks can be reduced and some process steps can be omitted.

In the preferable embodiment, the gate dielectrics of the first and the third MOSFETs are formed by using a common first mask and in some common steps, and the gate dielectrics of the second and the fourth MOSFETs are formed by using a common mask and in some common steps. In a more preferable embodiment, the gate conductors of the third and the fourth MOSFETs are doped by using a common mask and in some common steps for adjusting work function.

The number of the makes is reduced in the present method by common semiconductor regions and the common steps. Furthermore, the work function is adjusted by doping the gate conductors. Accordingly, failure of the CMOS structure due to mismatching of different masks is avoided.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF EMBODIMENTS OF THE DISCLOSURE

Figure 1:
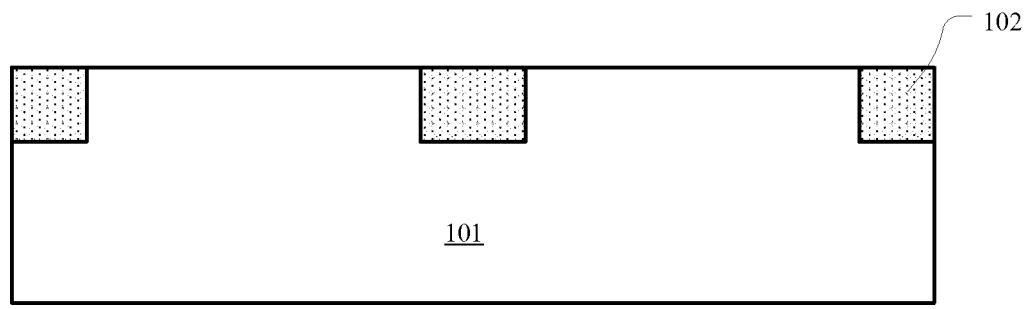
FIGS. 1 to 17 are cross-sectional views showing various steps of a method for manufacturing a CMOS structure according to an embodiment of the present disclosure.

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region, but not in a implantation region of the another region.

In the present application, the term "semiconductor structure" means generally the whole semiconductor structure formed at each step of the method for manufacturing the semiconductor device, including all of the layers and regions having been formed. The term "source/drain region" means at least one of a source region and a drain region of a MOSFET.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Unless the context clearly indicates otherwise, each part of the semiconductor device can be made of material(s) well known to one skilled person in the art. The semiconductor material includes for example group III-V semiconductor, such as GaAs, InP, GaN, and SiC, and group IV semiconductor, such as Si, and Ge. A gate conductor may be made of any conductive material, such as metal, doped polysilicon, and a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, Ni3Si, Pt, Ru, W, and their combinations. A gate dielectric may be made of SiO2 or any material having dielectric constant larger than that of SiO2. For example, the gate dielectric may be made of one selected from a group consisting of oxides, nitrides, oxynitrides, silicates, aluminates, and titanates. Moreover, the gate dielectric can be made of those developed in the future, besides the above known materials.

The disclosure can be embodied in various forms, some of which will be described below.

Referring to FIGS. 1 to 17, various stages of a method for manufacturing a CMOS structure according to an embodiment of the present disclosure will be described hereinbelow.

As shown in FIG. 1, shallow trench isolations (STIs) 102 are formed in a semiconductor substrate 101. The shallow trench isolations 102 are used for defining various active regions of the CMOS structure. In an example, the semiconductor substrate 101 is a single-crystal silicon substrate.

In a preferable embodiment, a photoresist layer is formed on a surface of the semiconductor substrate, and then patterned by lithography to be a photoresist mask which exposes those regions other than active regions (also being referred to as field regions). Portions of the semiconductor substrate 101 are removed by a conventional etching process which is performed from top to bottom through openings in the photoresist mask to form shallow trenches. The etching may be dry etching such as ion beam milling, plasma etching, reactive ion etching, laser ablation and the like, or wet etching using a selective solution of etchant. Then, the photoresist mask is removed by ashing or dissolution with a solvent.

An insulating layer is then formed on a surface of the semiconductor structure by a conventional deposition process. The insulating layer has a thickness at least large enough to fill up the shallow trenches. For example, the deposition process may be one selected from a group consisting of electron beam evaporation (EBM), chemical vapor deposition (CVD), atomic layer deposition (ALD), and sputtering. For example, a surface of the semiconductor structure may be planarized by chemical mechanical polishing so that portions of the insulating layer outside the shallow trenches are removed and the remaining portions of the insulating layer form shallow trench isolation (STI).

Figure 2:
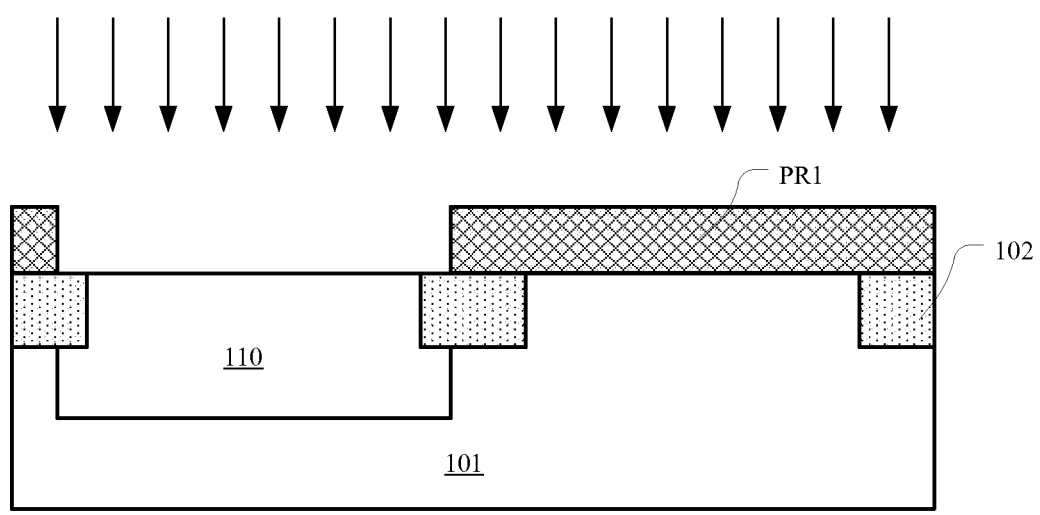

Next, a photoresist layer is formed on a surface of the semiconductor structure, and then patterned by lithography to be a photoresist mask PR1 which exposes active regions of P-type MOSFETs. A first ion implantation is performed by a conventional ion implantation and driving-in process to form an N-type well region 110 of a P-type MOSFET in the semiconductor substrate 101, as shown in FIG. 2. A dopant reaches the semiconductor substrate 101 through the openings in the photoresist mask PR1 in the ion implantation. Then, the photoresist mask is removed by ashing or dissolution with a solvent.

An N-type semiconductor layer or region may be formed by implanting an N-type dopant such as P or As in the semiconductor layer or region. By controlling implantation parameters, such as implantation energy and dosage, the dopant may reach a predetermined depth and may have a predetermined doping concentration.

Figure 3:
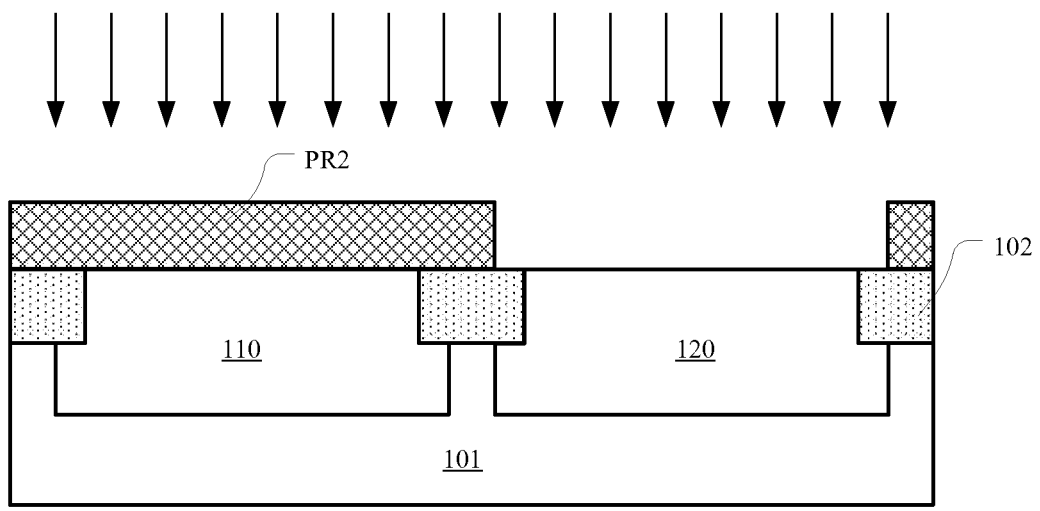

Next, a photoresist layer is formed on a surface of the semiconductor structure, and then patterned by lithography to be a photoresist mask PR2 which exposes active regions of N-type MOSFETs. A second ion implantation is performed by a conventional ion implantation and driving-in process to form a P-type well region 120 of an N-type MOSFET in the semiconductor substrate 101, as shown in FIG. 3. A dopant reaches the semiconductor substrate 101 through the openings in the photoresist mask PR2 in the ion implantation. Then, the photoresist mask is removed by ashing or dissolution with a solvent.

A P-type semiconductor layer or region may be formed by implanting a P-type dopant such as B in the semiconductor layer or region. By controlling implantation parameters, such as implantation energy and dosage, the dopant may reach a predetermined depth and may have a predetermined doping concentration.

In the first ion implantation and the second ion implantation, the N-type well region 110 and the P-type well region 120 are defined respectively by the photoresist masks. The photoresist masks may be designed to have predetermined patterns so that the N-type well region 110 and the P-type well region 120 are separated from each other by the shallow trench isolation 102 at the surface of the semiconductor structure, and are separated from each other with a distance below the shallow trench isolation 102.

Figure 4:
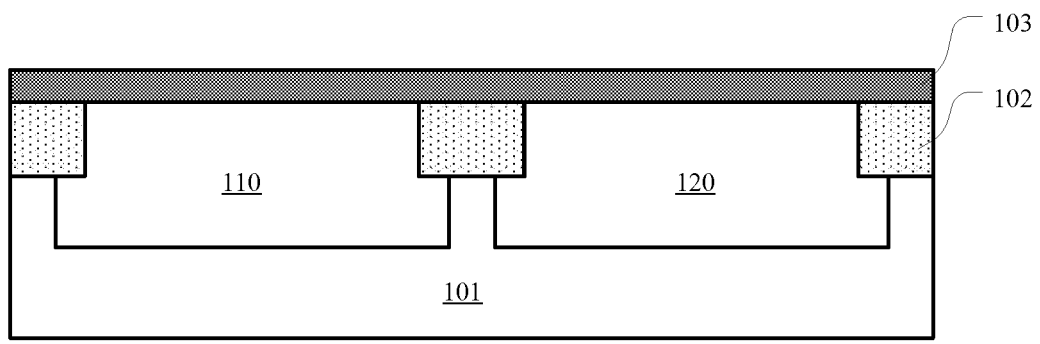

Next, a first gate dielectric 103 is then formed on the surface of the semiconductor structure by the above conventional deposition process, for example, by thermal oxidation, as shown in FIG. 4. In an example, the first gate dielectric 103 is made of silicide oxide, with a thickness of about 10-15 nanometers. As will be described hereinbelow, the first gate dielectric 103 is to be used as gate dielectrics of N-type high-voltage MOSFETs and P-type high-voltage MOSFETs.

Figure 5:
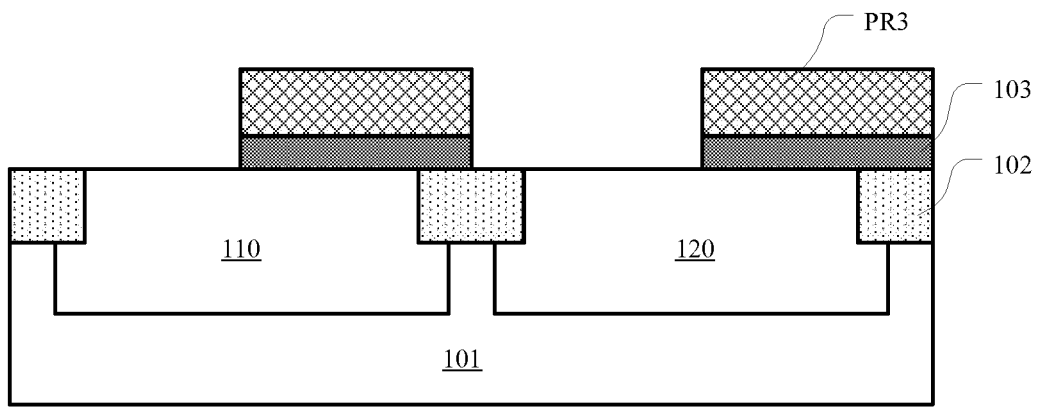

Next, a photoresist layer is formed on a surface of the semiconductor structure, and then patterned by lithography to be a photoresist mask PR3. Etching is performed through the photoresist mask PR3. The etching is performed from top to bottom through the openings in the photoresist mask to remove exposed portions of the first gate dielectric 103, as shown in FIG. 5. Due to selectivity of the etchant, the etching stops at the surface of the N-type well region 110 and the P-type well region 120. In the etching, the pattern of the photoresist mask PR3 defines a shape of the first gate dielectric 103. Then, the photoresist layer is removed by ashing or dissolution with a solvent.

Figure 6:
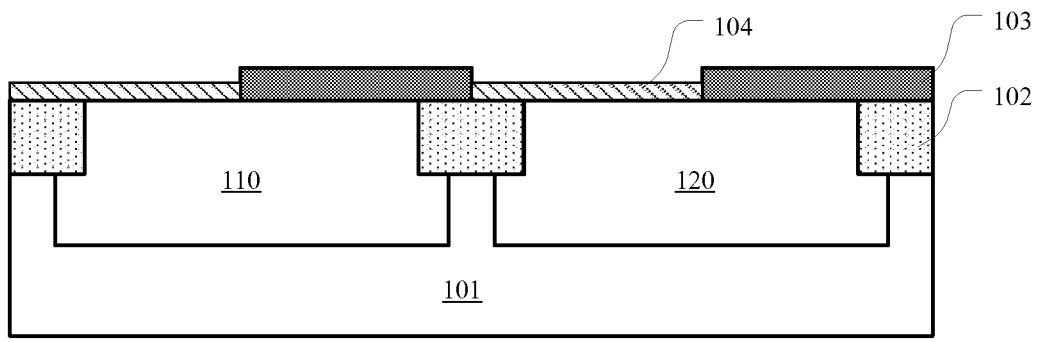

Next, a second gate dielectric 104 is then formed on the surface of the semiconductor structure by the above conventional deposition process, for example, by thermal oxidation, as shown in FIG. 6. In an example, the second gate dielectric 104 is made of silicon oxide, with a thickness of about 2.5-4 nanometers. Consequently, the first gate dielectric 103 and the second gate dielectric 104 are formed as having different thicknesses, both on the N-type well region 110 and on the P-type well region 120. As will be described hereinbelow, the second gate dielectric 104 is to be used as gate dielectrics of N-type low-voltage MOSFETs and P-type low-voltage MOSFETs.

Figure 7:
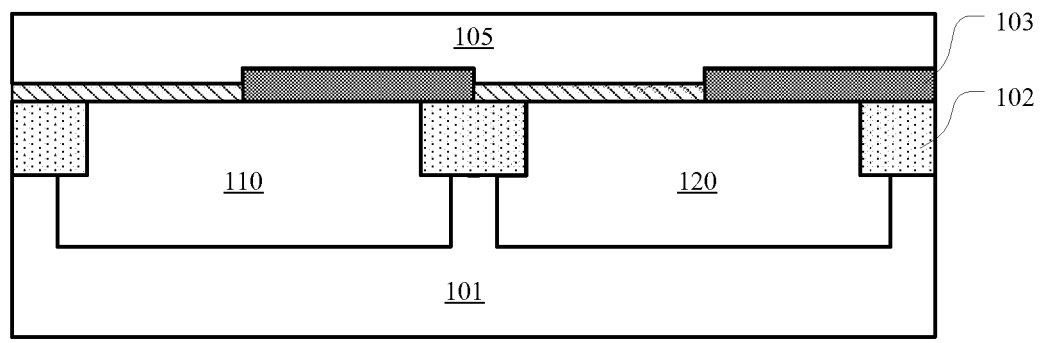

Next, a gate conductor 105 is formed on the first gate dielectric 103 and on the second gate dielectric 104 by the above conventional deposition process, as shown in FIG. 7. In an example, the gate conductor 105 is a polysilicon layer, with a thickness of about 200 nanometers.

Figure 8:
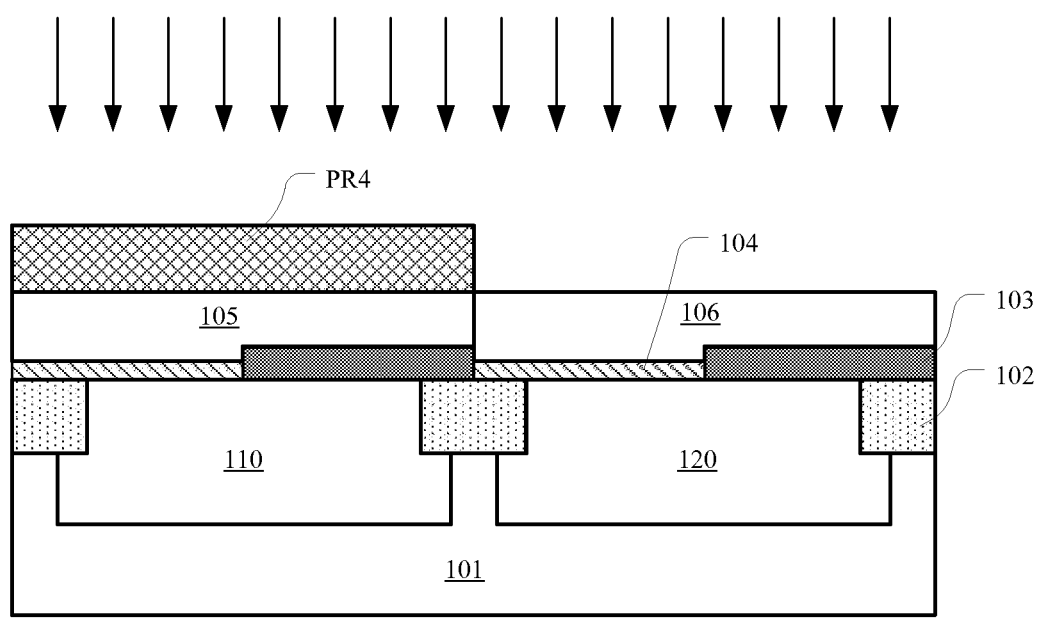

Next, a photoresist layer is formed on a surface of the semiconductor structure, and then patterned by lithography to be a photoresist mask PR4 which exposes active regions of N-type MOSFETs. A third ion implantation is performed by a conventional ion implantation process, as shown in FIG. 8. A dopant reaches the gate conductor 106 through the openings in the photoresist mask PR4 in the ion implantation. Then, the photoresist mask is removed by ashing or dissolution with a solvent.

It is well known that a threshold voltage of a MOSFET is mainly determined by work function difference between the gate conductor and the channel region. In a conventional process, a gate conductor 106 of an N-type MOSFET is typically doped to adjust its work function, which further changes the threshold voltage.

Figure 9:
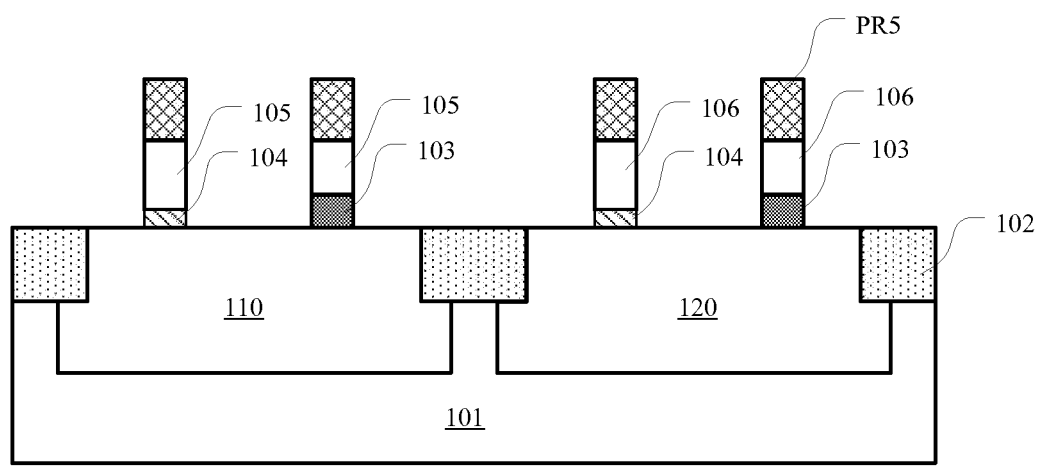
Figure 10:
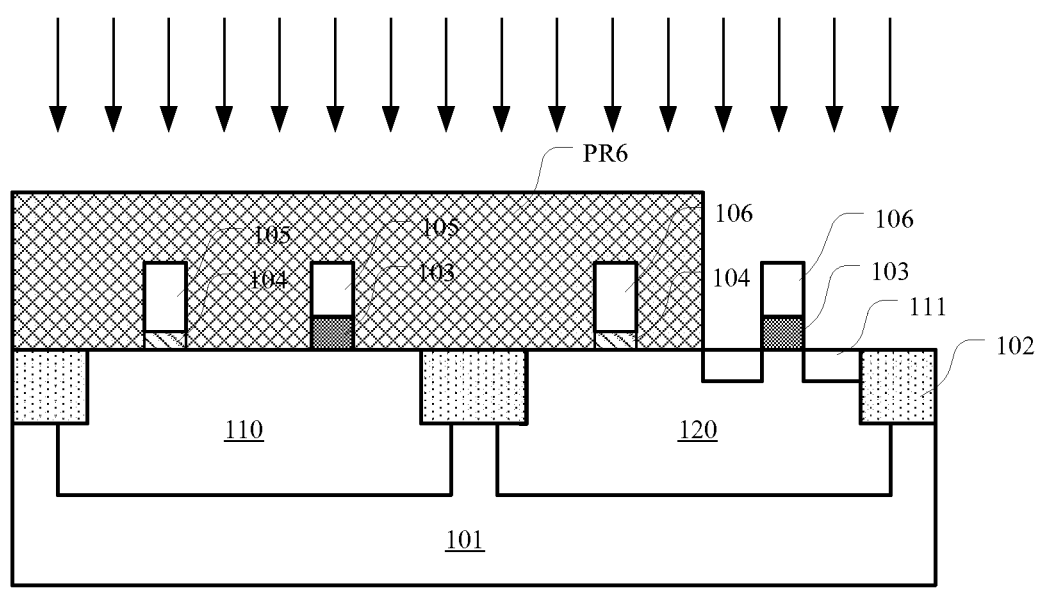
Figure 11:
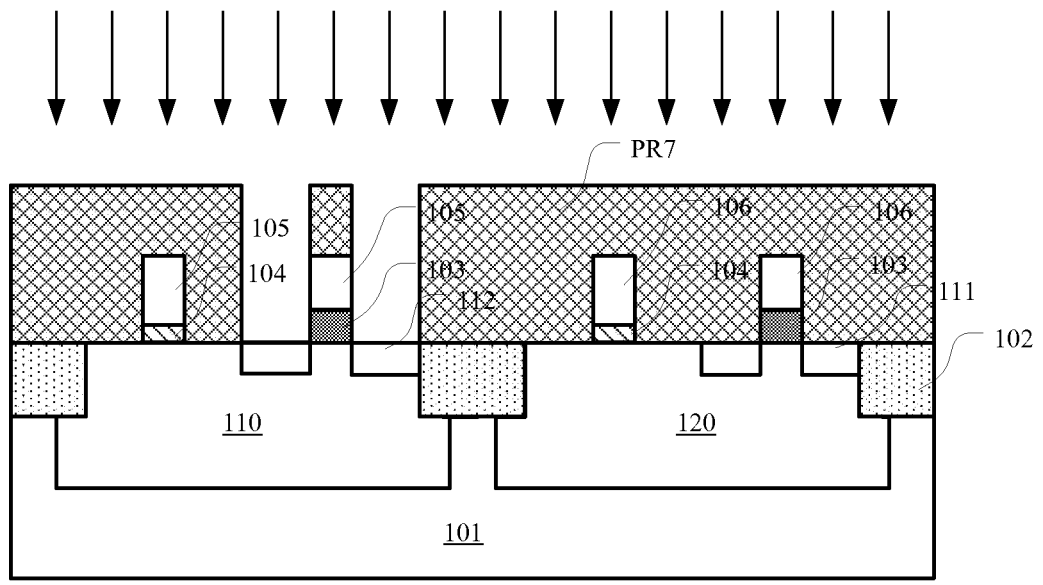
Figure 12:
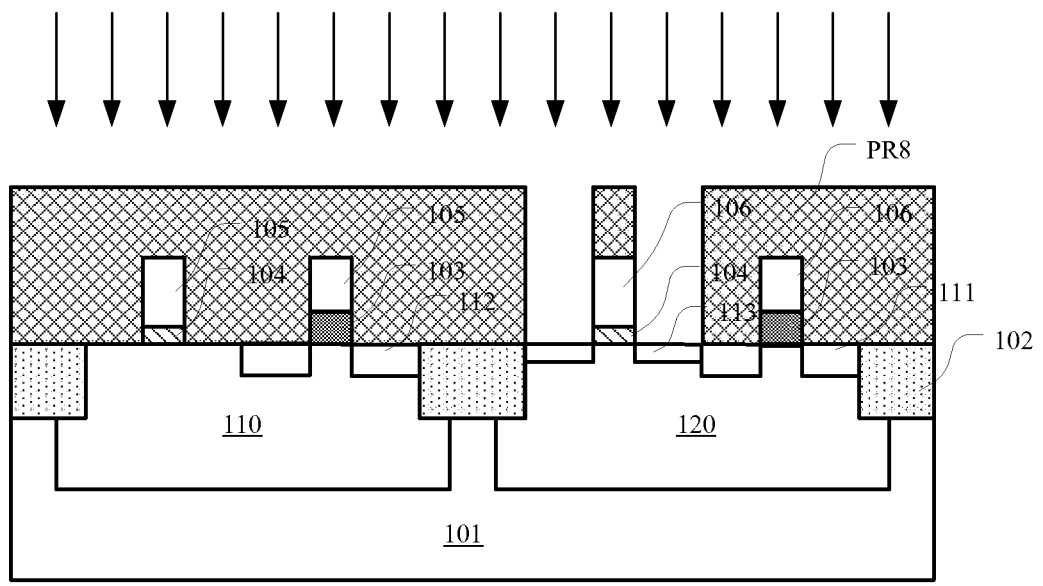
Figure 13:
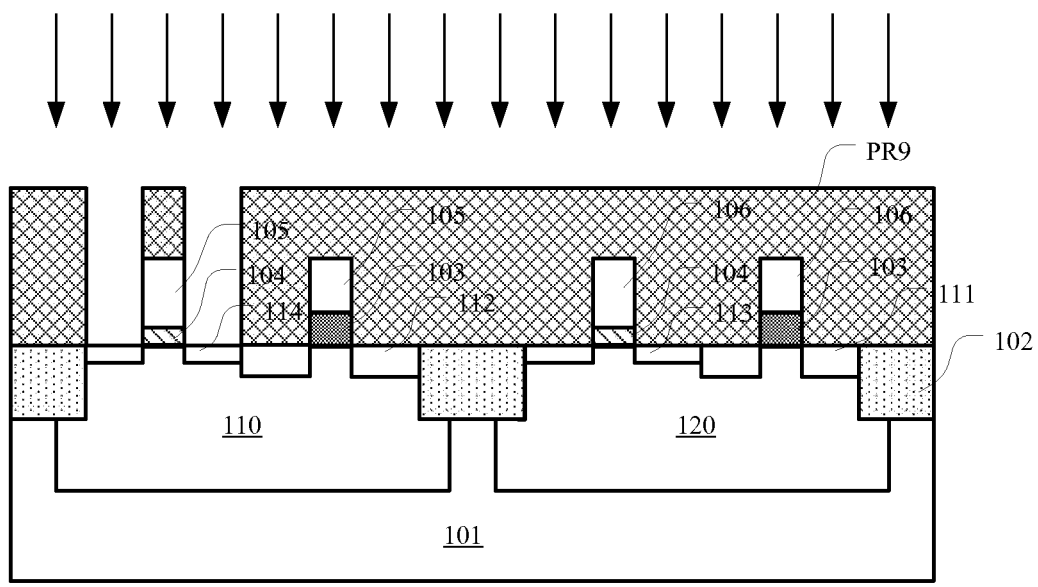

Next, a photoresist layer is formed on a surface of the semiconductor structure, and then patterned by lithography to be photoresist mask PR5. Etching is performed through the photoresist mask PR5. The etching is performed from top to bottom through the openings in the photoresist mask to remove exposed portions of the gate conductor 105, the first gate dielectric 103 and the second gate dielectric 104, as shown in FIG. 9. Due to selectivity of the etchant, the etching stops at the surface of the N-type well region 110 and the P-type well region 120. In the etching, the pattern of the photoresist mask PR5 defines a shape of the gate stack. Then, the photoresist layer is removed by ashing or dissolution with a solvent.

In FIG. 9, the gate stacks of four MOSFETs are shown, including a low-voltage MOSFET and a high-voltage MOSFET in the N-type well region 110, and a low-voltage MOSFET and a high-voltage MOSFET in the N-type well region 120, from left to right.

Furthermore, the photoresist masks PR6, PR7, PR8, and PR9 are formed successively on the surface of the semiconductor structure, through which the fourth to the seventh ion implantations are performed respectively, as shown in FIGS. 10 to 13. Each of the masks PR6, PR7, PR8, and PR9 exposes an active region of a MOSFET, while blocking active regions of other MOSFETs. In the ion implantations, not only the photoresist masks PR6, PR7, PR8, and PR9 are used, but also the gate conductor 105, the gate conductor 106 and the shallow trench isolation 102 are also used together as a hard mask. Then, the photoresist mask is removed by ashing or dissolution with a solvent. Consequently, lightly-doped drain regions 114 of the P-type low-voltage MOSFETs and lightly-doped drain regions 112 of the P-type high-voltage MOSFETs are formed in the N-type well region 110 near the surface, and lightly-doped drain regions 113 of the N-type low-voltage MOSFETs and lightly-doped drain regions 111 of the N-type high-voltage MOSFETs are formed in the P-type well region 120 near the surface.

An N-type dopant is used in the ion implantation in the P-type well region 110. Thus, both the lightly-doped region 114 and the lightly-doped region 112 are N-type doped regions with different doping concentrations and different doping profiles. An P-type dopant is used in the ion implantation in the N-type well region 120. Thus, both the lightly-doped region 113 and the lightly-doped region 111 are P-type doped regions with different doping concentrations and different doping profiles.

Figure 14:
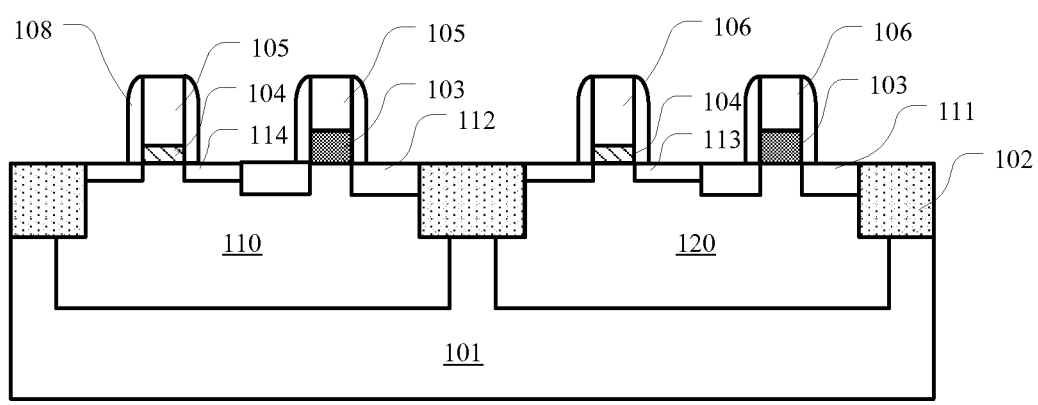

Next, a nitride layer is then formed on the surface of the semiconductor structure by the above conventional deposition process. In an example, the nitride layer is a silicon nitride layer with a thickness of about 5-30 nanometers. Lateral portions of the nitride layer are removed by anisotropic etching, for example, reactive ion etching. Consequently, only vertical portions of the nitride layer remain at side walls of the gate conductors 105 and 106 to form gate spacers 108, as shown in FIG. 14.

Figure 15:
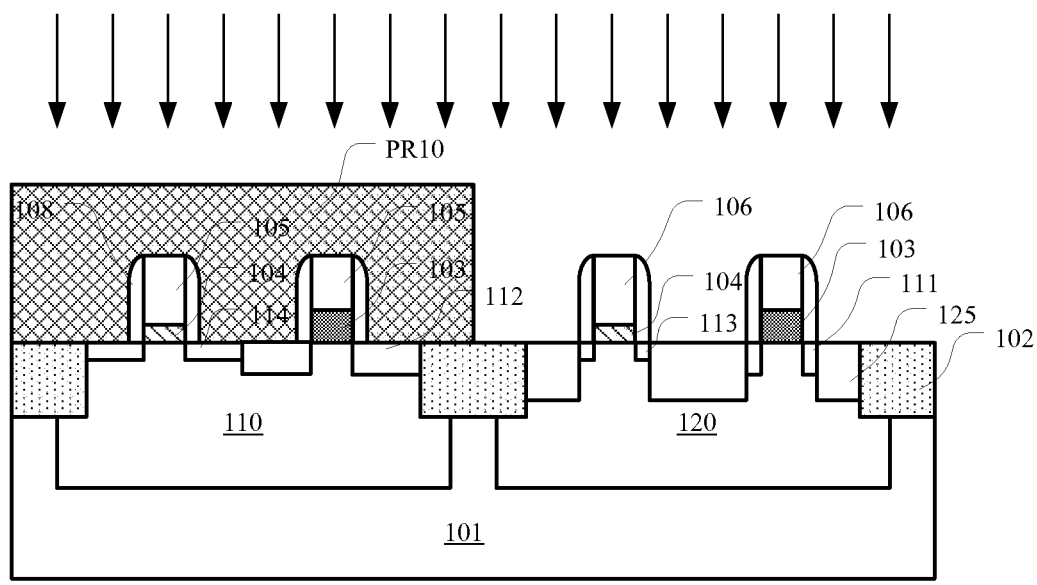

Next, a photoresist layer is formed on a surface of the semiconductor structure, and then patterned by lithography to be a photoresist mask PR10. The photoresist mask PR10 blocks the active regions of the P-type MOSFETs and exposes the active regions of the N-type MOSFETs. An eighth ion implantation is performed by using the photoresist mask PR10 and with the gate conductor 106, the gate spacers 108 and the shallow trench isolation 102 together as a hard mask. A dopant reaches the P-type well region 120 through the openings in the photoresist mask PR10 in the ion implantation to form N-type source/drain regions 125, as shown in FIG. 15. A portion of the N-type LDD regions 122 below the gate spacers 108 remains. Then, the photoresist mask is removed by ashing or dissolution with a solvent.

Next, a photoresist layer is formed on a surface of the semiconductor structure, and then patterned by lithography to be a photoresist mask PR11. The photoresist mask PR11 blocks the active regions of the N-type MOSFETs and exposes the active regions of the P-type MOSFETs. A ninth ion implantation is performed by using the photoresist mask PR11 and with the gate conductor 105, the gate spacers 108 and the shallow trench isolation 102 together as a hard mask.

Figure 16:
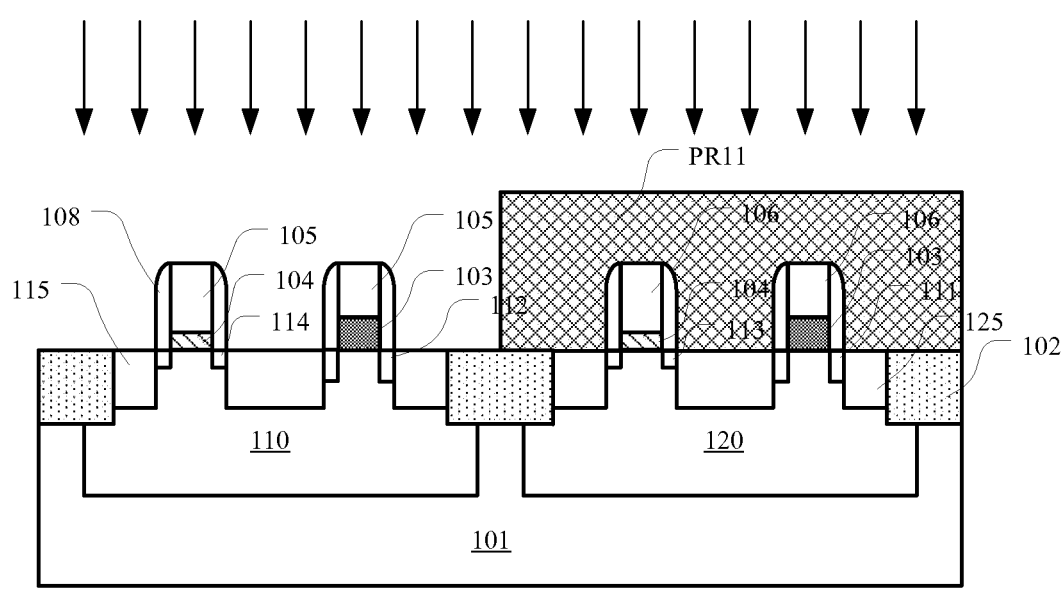

A dopant reaches the N-type well region 110 through the openings in the photoresist mask PR11 in the ion implantation to form a P-type source/drain 115, as shown in FIG. 16. A portion of the P-type LDD region 112 below the gate spacers 108 remains. Then, the photoresist mask is removed by ashing or dissolution with a solvent.

Preferably, spike anneal and/or laser anneal may be performed at the temperature of about 1000-1100° C. to activate the dopants after the step of forming the source/drain regions 125 for the N-type MOSFET and the step of forming the source/drain regions 115 for the P-type MOSFET.

Preferably, a metal layer is formed on the surface of the semiconductor structure by the above conventional deposition process, after the step of forming the source/drain regions 125 for the N-type MOSFET and the step of forming the source/drain regions 115 for the P-type MOSFET. The metal layer is made of one from a group consisting of Ni, W, Ti, Co and alloys of any of Ni, W, Ti, Co with others. In an example, the metal layer is a Co layer formed by sputtering. In an example, thermal anneal is then performed for about 1-10 seconds at the temperature of about 300-500° C.

The thermal anneal cause silicidation of the metal layer at surfaces of the source/drains 125 of the N-type MOSFET and the source/drains 115 of the P-type MOSFET to form a metal silicide layer 109. Meanwhile, the silicidation also occurs at a surface of the gate conductor 105 and the gate conductor 106. The metal silicide layer 109 will reduce contact resistance with the source and drain regions. Remaining portions of the metal layer 111 are removed by well-known dry etching or wet etching, as shown in FIG. 17.

Figure 17:
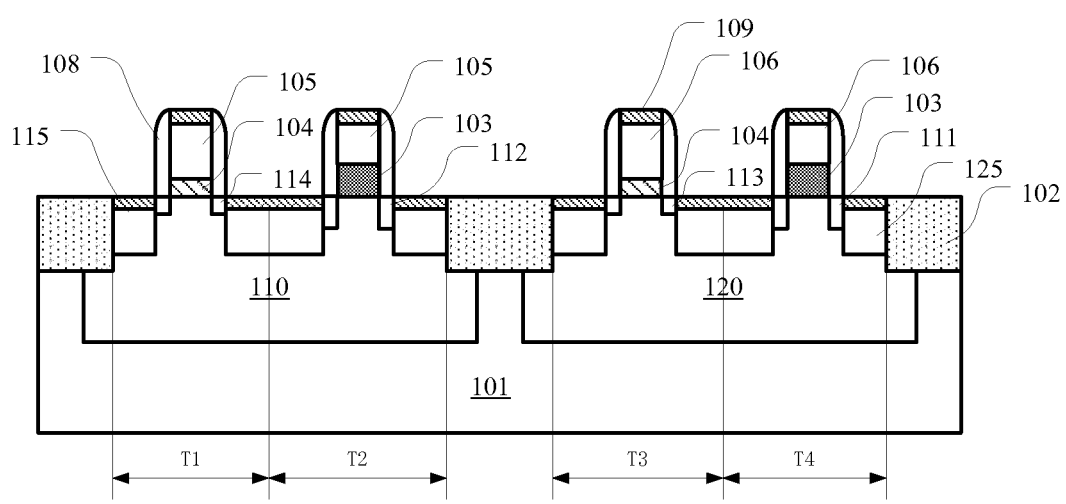

In FIG. 17, the gate stacks of four MOSFETs are shown, including a low-voltage MOSFET T1 and a high-voltage MOSFET T2 in the N-type well region 110, and a low-voltage MOSFET T3 and a high-voltage MOSFET T4 in the N-type well region 120, from left to right.

After the steps described in connection with FIGS. 1 to 17, other portions of the CMOS structure are then formed from the resultant semiconductor structure, by subsequent steps of forming an interlayer dielectric layer, forming conductive plugs in the interlayer dielectric layer, forming wirings and electrodes on the surface of the interlayer dielectric layer, and the like.

In the above embodiment, the N-type well region 110 and the P-type well region 120 are formed in the semiconductor substrate 101 respectively. However, only P-type well region 120 can be formed, without the need for the N-type well region 110, if the semiconductor substrate is N-type itself. Similarly, only N-type well region 110 can be formed, without the need for the P-type well region 120, if the semiconductor substrate is P-type itself.

Moreover, in the method according to the above embodiment, a low-voltage MOSFET and a high-voltage MOSFET are described as being formed in an N-type well region 110 and having gate dielectrics with different thicknesses, and a low-voltage MOSFET and a high-voltage MOSFET are described as being formed in a P-type well region 120 and having gate dielectrics with different thicknesses. However, it can be understood that many MOSFETs having gate dielectrics with different thicknesses may be formed in each of the N-type well region 110 and the P-type well region 120, including one or more N-type MOSFETs and one or more P-type MOSFETs.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A method for manufacturing a CMOS structure, comprising:
   forming shallow trench isolation in a semiconductor substrate, for defining a first region for a first MOSFET and a second MOSFET of a first type and a second region for a third MOSFET and a fourth MOSFET of a second type;
   forming a first gate dielectric and a second gate dielectric on said semiconductor substrate, wherein said first gate dielectric and said second gate dielectric have different thicknesses and are adjacent to each other in each of said first region and said second region;
   forming a gate conductor on said first gate dielectric and second gate dielectric;
   forming a first gate stack of said first MOSFET, a second gate stack of said second MOSFET, a third gate stack of said third MOSFET and a fourth gate stack of said fourth MOSFET by patterning said gate conductor, said first gate dielectric and said second gate dielectric;
   forming gate spacers at side walls of said first gate stack, said second gate stack, said third gate stack and said fourth gate stack; and
   forming source/drain regions of said first MOSFET, said second MOSFET, said third MOSFET and said fourth MOSFET.

2. The method according to claim 1, wherein said step of forming said first gate dielectric and said second gate dielectric comprises:
   forming said first gate dielectric having a first thickness on a surface of said semiconductor substrate by thermal oxidation;
   patterning said first gate dielectric to expose a portion of said surface of said semiconductor substrate in each of said first region and said second region; and
   forming said second gate dielectric having a second thickness on said portion of said surface of said semiconductor substrate by thermal oxidation,
   wherein said first thickness is larger than said second thickness.

3. The method according to claim 2, wherein said first gate dielectric is patterned by etching through a first photoresist mask.

4. The method according to claim 2, between said step of forming said gate conductor and said step of forming said first gate stack, said second gate stack, said third gate stack and said fourth gate stack, further comprising: doping said gate conductor in said second region through a second photoresist mask for adjusting work function, wherein said second photoresist exposes said second region and blocks said first region.

5. The method according to claim 2, after said steps of forming said first gate stack, said second gate stack, said third gate stack and said fourth gate stack and before said step of forming said source/drain regions, further comprising:
   forming lightly-doped drain regions of said first MOSFET, through a third photoresist mask and with said first gate stack as a hard mask;
   forming lightly-doped drain regions of said second MOSFET, through a fourth photoresist mask and with said second gate stack as a hard mask;
   forming lightly-doped drain regions of said third MOSFET, through a fifth photoresist mask and with said third gate stack as a hard mask; and
   forming lightly-doped drain regions of said fourth MOSFET, through a sixth photoresist mask and with said fourth gate stack as a hard mask,
   wherein each of said third photoresist mask, said fourth photoresist mask, said fifth photoresist mask and said sixth photoresist mask exposes respective one of active regions of said first MOSFET, said second MOSFET, said third MOSFET and said fourth MOSFETs, and blocks other regions of said semiconductor substrate.

6. The method according to claim 2, wherein said step of forming said source/drain region comprises:
   forming source/drain regions of said third MOSFET and said fourth MOSFET, through a seventh photoresist mask and with said third gate stack and said fourth gate stack as a hard mask; and
   forming source/drain regions of said first MOSFET and said second MOSFET, through a eighth photoresist mask and with said first gate stack and said second gate stack as a hard mask,
   wherein said seventh photoresist mask exposes said second region and blocks said first region, and said eighth photoresist mask exposes said first region and blocks said second region.

7. The method according to claim 2, wherein said gate conductor is made of polysilicon.

8. The method according to claim 2, after forming said source/drain regions of said first MOSFET, said second MOSFET, said third MOSFET and said fourth MOSFET, further comprising: performing silicidation to form a metal silicide layer on said source/drain regions, and on said gate conductor.

9. The method according to claim 2, between said step of forming said shallow trench isolation and said step of forming said first gate dielectric and said second gate dielectric, further comprising at least one of:
   forming an N-type well region in said first region in said semiconductor substrate; and
   forming a P-type well region in said second region in said semiconductor substrate.

10. The method according to claim 2, wherein said first MOSFET and said second MOSFET in said first region are P-type MOSFETs, and said third MOSFET and said fourth MOSFET in said second region are N-type MOSFETs.

* * * * *